United States Patent [19]
Bradshaw et al.

[11] Patent Number: 4,566,104
[45] Date of Patent: Jan. 21, 1986

[54] TESTING DIGITAL ELECTRONIC CIRCUITS

[75] Inventors: George M. Bradshaw, Stockport; Peter L. L. Desyllas; Keith McLaren, both of Wilmslow, all of England

[73] Assignee: International Computers Limited, London, England

[21] Appl. No.: 545,520

[22] Filed: Oct. 26, 1983

[30] Foreign Application Priority Data

Nov. 20, 1982 [GB] United Kingdom ............... 8233179

[51] Int. Cl.$^4$ ........................................... G01R 31/28
[52] U.S. Cl. ..................................... 371/15; 324/73 R
[58] Field of Search ............... 371/15, 25; 324/73 R, 324/73 AT

[56] References Cited

U.S. PATENT DOCUMENTS

| 3,815,025 | 6/1974 | Jordan | 324/73 R |
| 3,924,144 | 12/1975 | Hadamard et al. | 324/73 R |
| 3,961,254 | 6/1976 | Cavaliere et al. | 324/73 R |
| 4,340,857 | 7/1982 | Fasang | 324/73 R |
| 4,504,784 | 3/1985 | Goel et al. | 324/73 R |

OTHER PUBLICATIONS

Tsui, In-Situ Testability Design (IST-D)-A New Approach for Testing High-Speed LSI/VLSI Logic, Proc. of the IEEE, vol. 70, No. 1, Jan. 1982, pp. 59–78.
Fanatsu et al., Designing Digital Circuits with Easily Testable Consideration, 1978 Semiconductor Test Conference, Cherry Hill, N.J., 31 Oct.–2 Nov. 1978, pp. 98–102.
Williams, Testing of LSI Logic Circuits Containing Imbedded Shift Arrays, IBM Tech. Discl. Bulletin, vol. 20, No. 10, Mar. 1978, pp. 4021–4022.
Kurtzenburg and Roth, "Partitioning for Testing", IBM Technical Disclosure Bulletin, vol. 25, No. 3B, Aug. 1982, pp. 1733–1734.

Primary Examiner—Charles E. Atkinson
Attorney, Agent, or Firm—Lee, Smith & Zickert

[57] ABSTRACT

A large-scale integrated circuit chip includes a plurality of bistables connected to combinational logic. In a diagnostic mode, the bistables are operated as a serial shift register, allowing test data to be shifted through the chip between diagnostic input and output pins (LPIN,LPOUT). In a chip test mode, the serial shift register is split into a number of shift register portions, each of which is connected between a separate pair of input and output pins. This allows test data to be shifted through all the shift register portions in parallel so as to speed up testing of the chip.

4 Claims, 1 Drawing Figure

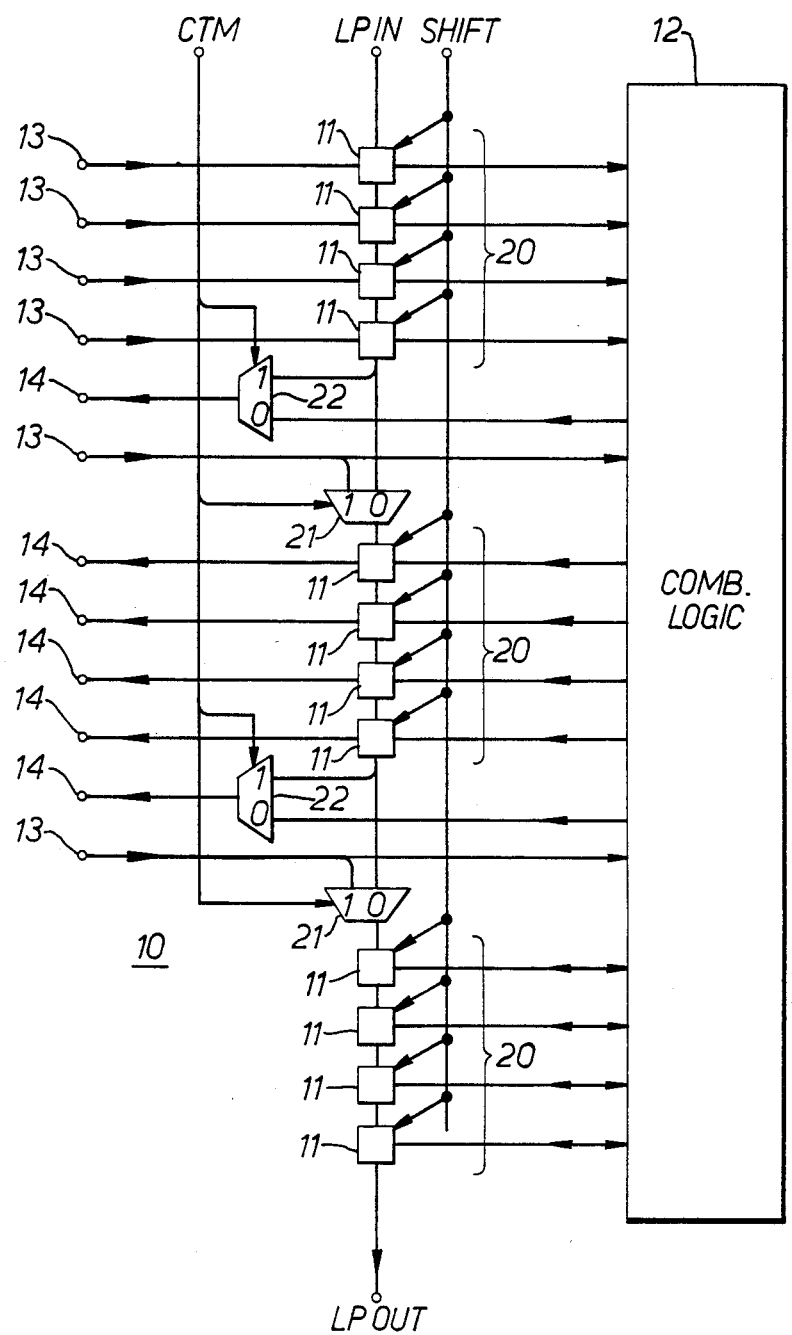

TESTING DIGITAL ELECTRONIC CIRCUITS

BACKGROUND TO THE INVENTION

This invention relates to testing digital electronic circuits, and is particularly, although not exclusively concerned with testing large scale integrated (LSI) circuits.

A digital circuit can generally be considered as consisting of a number of data storage elements (e.g. bistable circuits) interconnected by a combinational logic network (e.g. AND gates, OR gates and so on). The testing of such circuits can be very complex, especially if the circuit is an LSI chip, which makes it difficult to gain access to the storage elements within the chip.

British Patent Specification No. 1,546,147 describes a digital electronic circuit having a diagnostic mode in which the data storage elements are connected together in series to act as a shift register. This allows test patterns to be shifted serially into the storage elements, and the results of test sequences to be shifted out serially for analysis. This can greatly ease the problem of testing an LSI chip, since it provides access to internal registers on the chip which would otherwise be inaccessible. Since the test patterns and results are shifted serially, the number of extra terminals required for testing is minimised.

However, if the number of storage elements in the circuit is large, it may take an excessively long time to shift data through the shift register, and hence testing will be a slow process. This problem is particularly severe when it is required to test LSI chips during or after manufacture, when it is desirable to perform the tests as quickly as possible.

One object of the present invention is therefore to reduce the time required for testing a digital electronic circuit.

SUMMARY OF THE INVENTION

According to the invention there is provided a digital electronic circuit including a plurality of data storage elements interconnected by a combinational logic network and having a plurality of terminals for input to and output from the circuit in normal operation, wherein in a diagnostic mode of operation the data storage elements are made to act as a serial shift register allowing information to be shifted serially through the storage elements, between input and output terminals, characterised in that in a test mode the shift register is split into a plurality of shift register portions and each of these portions is connected between a separate pair of said terminals allowing information to be shifted through all the shift register portions in parallel.

BRIEF SUMMARY OF THE DRAWINGS

One embodiment of the invention will now be described by way of example with reference to the accompanying drawing is a schematic diagram of an LSI chip.

DESCRIPTION OF AN EMBODIMENT OF THE INVENTION

Referring to the drawing, the LSI chip 10 contains a plurality of data storage elements (bistables) 11, interconnected by a combinational logic network 12. As illustrated, some of the bistables 11 provide inputs to the network 12, and some receive outputs from the network 12, while others are both inputs and outputs. The chip has input and output pins 13 and 14, some of which are connected to the bistables 11 and others of which are connected to the network 12, for input and output of data.

The exact form of the logic network 12 and the functions of the bistables 11 form no part of the present invention and so will not be described herein. For example, the logic network may be arranged as an arithmetic unit and the bistables may form input and output registers for holding operands and results.

As well as being connected to the logic network 12, the bistables are also connected together to form a serial diagnostic path between diagnostic input and output pins LPIN and LPOUT. Each bistable includes an AND gate (not shown) for controlling input of data from the preceding bistable in the diagnostic path. The AND gates are controlled by a control signal SHIFT. Thus, when SHIFT=0, the gates are all disabled, inhibiting the serial connections between the bistables, and when SHIFT=1, the gates are enabled, allowing data to be shifted through the bistables along the serial diagnostic path.

It should be noted that these serial connections are additional to the normal functional connections between the bistables 11 and the logic network 12, and are not used in normal operation of the circuit.

As shown, the diagnostic path consists of a plurality of portions 20 each containing a plurality of bistables 11. It should be appreciated that the arrangement shown in the drawing is by way of illustration only; the number of portions 20 and the number of bistables in each portion may vary according to requirements. Typically, the path may have four portions, each containing up to eighteen bistables.

The input of the first portion 20 is derived directly from the pin LPIN, while the inputs of the other portions are derived from two-way multiplexers 21. The first input (0) of each of these multiplexers is connected to the serial output of the preceding portion 20, while the second input (1) is connected to one of the chip pins 13 which normally acts as an input terminal for the logic network 12.

The chip also contains a further plurality of two-way multiplexers 22. The outputs of these multiplexers are connected to chip pins 14 which normally act as output terminals for the logic network 12. The first input (0) of each multiplexer 22 is connected to an output of the logic network 12, while the second input (1) is connected to the serial output of one of the portions 20.

The multiplexers 21,22 are all controlled by a signal CTM, such that when CTM=0, the first input (0) of each multiplexer is selected, and when CTM=1 the second input is selected.

The chip has three modes of operation, referred to herein as the normal, diagnostic and chip test modes.

Normal Mode

This is the normal function mode of operation, for use when the chip is connected up as part of a data processing system and is performing its normal data processing function.

In this mode, the control signals SHIFT and CTM are both set to the value zero. Thus, the serial connections between the bistables 11 are disabled, so that only the normal functional connections between the bistables 11 and the logic network 12 are operative. Also, the multiplexers 21,22 are switched to their first inputs (0) so that the corresponding pins 13,14 are connected only to the logic network 12 and hence serve their normal functions as input/output terminals for the network.

Diagnostic Mode

This mode is intended for use in diagnosis and testing of the chip as part of a complete data processing system.

In this mode, the control signals have the values SHIFT=1 and CTM=0. Hence, in this case, the serial connections between the bistables 11 are all enabled, allowing data to be shifted through the diagnostic path between the pins LPIN and LPOUT. This permits test patterns to be loaded serially into the bistables, and the results of diagnostic tests to be read serially out of the chip.

Chip Test Mode

In this case, the control signals have the values SHIFT=1 and CTM=1. The effect of this is to split the diagnostic path into its individual portions 20, and to connect each portion between a separate pair of input-/output pins 13,14. (In the case of the first portion 20, LPIN provides the input pin, while in the case of the last portion LPOUT provides the output pin).

The chip test mode is intended to be used for testing the chip at the manufacturing stage, before it is assembled on a circuit board. The chip test mode facilitates rapid testing of the chip since test patterns can be shifted through all the portions 20 in parallel. For example, if each contains no more than eighteen bistables, the maximum time required to load information into the chip is only eighteen clock beats.

No extra pins are required for input and output of information in this mode, since it uses pins 13,14 which act as inputs and outputs to the logic network 12 in normal operation of the chip. The control signal CTM may be obtained from a special pin on the chip, or may be derived from existing pins, for example by decoding an otherwise unused value of a combination of control bits.

It should be noted that some of the portions 20 may have their serial outputs connected directly to a chip pin 14 as part of the normal operational connections on the chip and in this case the multiplexer 22 would be unnecessary. Also, some of the input pins 13 used in the chip test mode may not in fact be connected to the logic network 12 but may be spare pins.

The chip may contain more than one serial diagnostic path, with means for selecting one of the paths for shifting in the diagnostic mode. In this case, in the chip test mode, all the paths would be split into individual portions, enabling all the portions of all the paths to be loaded in parallel.

We claim:

1. A digital electronic circuit comprising:
   (a) a plurality of data storage elements having respective inputs and outputs,
   (b) a combinational logic network having a plurality of inputs and outputs,
   (c) first connection means connecting the outputs of at least some of the data storage elements to respective inputs of the combinational logic network and connecting at least some of the outputs of the combinational logic network to respective inputs of the data storage elements,
   (d) a plurality of input and output terminals,
   (e) second connection means connecting all the data storage elements together in series by way of their inputs and outputs, between a pair of said input and output terminals, thereby forming a serial shift path,
   (f) a control line for receiving a shift control signal, the control line being connected to all the data storage elements for enabling each of the data storage elements to receive data from said serial shift path,
   (g) at least one first multiplexer connected in said serial shift path and having
      (i) a first input connected to the output of one of said data storage circuits,
      (ii) a second input connected to one of the said input terminals, and
      (iii) an output connected to the input of another one of said data storage circuits,
   (h) at least one second multiplexer having
      (i) a first input connected to one of said outputs of the combinational logic network
      (ii) a second input connected to the output of one of said data storage elements, and
      (iii) an output connected to one of the said output terminals, and
   (j) a further control line for receiving a test mode control signal, the further control line being connected to all said first and second multiplexers for switching each said multiplexer to select its first input when the test mode control signal has one value and otherwise to select its second input.

2. A circuit as claimed in claim 1 wherein the second input of said first multiplexer is also connected to one of said inputs of the combinational logic network.

3. A circuit as claimed in claim 1 wherein there is a plurality of said first and second multiplexers, each first multiplexer being associated with a respective one of the second multiplexers and wherein the first input of each said first multiplexer and the second input of the associated second multiplexer are both connected to the output of the same data storage element.

4. A circuit according to claim 1 wherein the storage elements and combinational logic network are all parts of a single integrated circuit chip.

* * * * *